United States Patent
Kavalipurapu et al.

(10) Patent No.: US 9,842,655 B2
(45) Date of Patent: Dec. 12, 2017

(54) REDUCING VERIFICATION CHECKS WHEN PROGRAMMING A MEMORY DEVICE

(71) Applicant: Intel Corporation, Santa Clara, CA (US)

(72) Inventors: Kalyan Kavalipurapu, Santa Clara, CA (US); Allahyar Vahidimowlavi, San Jose, CA (US); Erwin Yu, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/963,184

(22) Filed: Dec. 8, 2015

(65) Prior Publication Data

US 2017/0162272 A1    Jun. 8, 2017

(51) Int. Cl.
| G11C 16/34 | (2006.01) |
| G11C 11/4076 | (2006.01) |
| G11C 11/56 | (2006.01) |
| G06F 3/06 | (2006.01) |

(52) U.S. Cl.
CPC .......... *G11C 16/3459* (2013.01); *G06F 3/061* (2013.01); *G06F 3/0625* (2013.01); *G06F 3/0655* (2013.01); *G06F 3/0688* (2013.01); *G11C 11/4076* (2013.01); *G11C 11/5628* (2013.01); *G11C 16/3445* (2013.01); *G11C 16/3454* (2013.01); *G11C 2211/5621* (2013.01)

(58) Field of Classification Search
CPC ............ G11C 16/3459; G11C 16/3445; G11C 16/3454
USPC ........................................ 365/185.22, 185.24
See application file for complete search history.

(56) References Cited

U.S. PATENT DOCUMENTS

| 8,456,915 | B2 | 6/2013 | Chen et al. |
| 2004/0109362 | A1 | 6/2004 | Gongwar et al. |
| 2005/0169057 | A1* | 8/2005 | Shibata ............... G11C 11/5628 365/185.28 |
| 2007/0097749 | A1 | 5/2007 | Li et al. |
| 2007/0147113 | A1 | 6/2007 | Mokhlesi et al. |
| 2009/0016104 | A1* | 1/2009 | Kim ..................... G11C 11/5628 365/185.03 |
| 2011/0194346 | A1 | 8/2011 | Yoon et al. |

(Continued)

OTHER PUBLICATIONS

Search Report and Written Opinion for International Patent Application PCT/US2016/061006 filed Nov. 8, 2016; dated Feb. 14, 2017; 10 pages.

*Primary Examiner* — Ly D Pham
(74) *Attorney, Agent, or Firm* — Thorpe North and Western, LLP; David W. Osborne

(57) ABSTRACT

Technology for an apparatus is described. The apparatus can include a memory controller with circuitry configured to initiate a program verify sequence to verify data written to a non-volatile memory (NVM). The program verify sequence can have one or more program verify levels that each correspond to memory cells in the NVM for which written data is being verified. The memory controller can detect an approximate percentage of memory cells for each program verify level in which data is successfully written. The memory controller can determine to skip subsequent program pulse verification checks in one or more program verify levels when the approximate percentage of memory cells in which data is successfully written is less than a defined threshold.

20 Claims, 11 Drawing Sheets

(56) References Cited

U.S. PATENT DOCUMENTS

| | | | |
|---|---|---|---|
| 2012/0224423 A1* | 9/2012 | Gurgi | G11C 11/5628 365/185.03 |
| 2012/0269002 A1* | 10/2012 | Yoon | G11C 16/3454 365/185.22 |
| 2013/0279264 A1 | 10/2013 | Kim | |
| 2015/0206593 A1* | 7/2015 | Khandelwal | G11C 11/5628 365/185.22 |

* cited by examiner

REDUCING VERIFICATION CHECKS WHEN PROGRAMMING A MEMORY DEVICE

BACKGROUND

Memory devices are typically provided as internal, semiconductor, integrated circuits in computers or other electronic devices. There are many different types of memory including volatile memory, for example, dynamic random access memory (DRAM) and synchronous dynamic random access memory (SDRAM), and non-volatile memory, for example, flash memory.

Flash memory devices typically use a one-transistor memory cell that allows for high memory densities, high reliability, and low power consumption. Changes in threshold voltage of the cells, through programming of a charge storage node (e.g., a floating gate or charge trap) determine the data state of each cell. Other non-volatile memories such as phase change memory (PCM) use other physical phenomena such as a physical material change or polarization to determine the data state of each cell. Common uses for flash and other solid state memories include personal computers, personal digital assistants (PDAs), digital cameras, digital media players, digital recorders, games, appliances, vehicles, wireless devices, cellular telephones, and removable portable memory modules among others. The uses for such memory continue to expand.

BRIEF DESCRIPTION OF THE DRAWINGS

Features and advantages of invention embodiments will be apparent from the detailed description which follows, taken in conjunction with the accompanying drawings, which together illustrate, by way of example, invention features; and, wherein.

Figure 1:
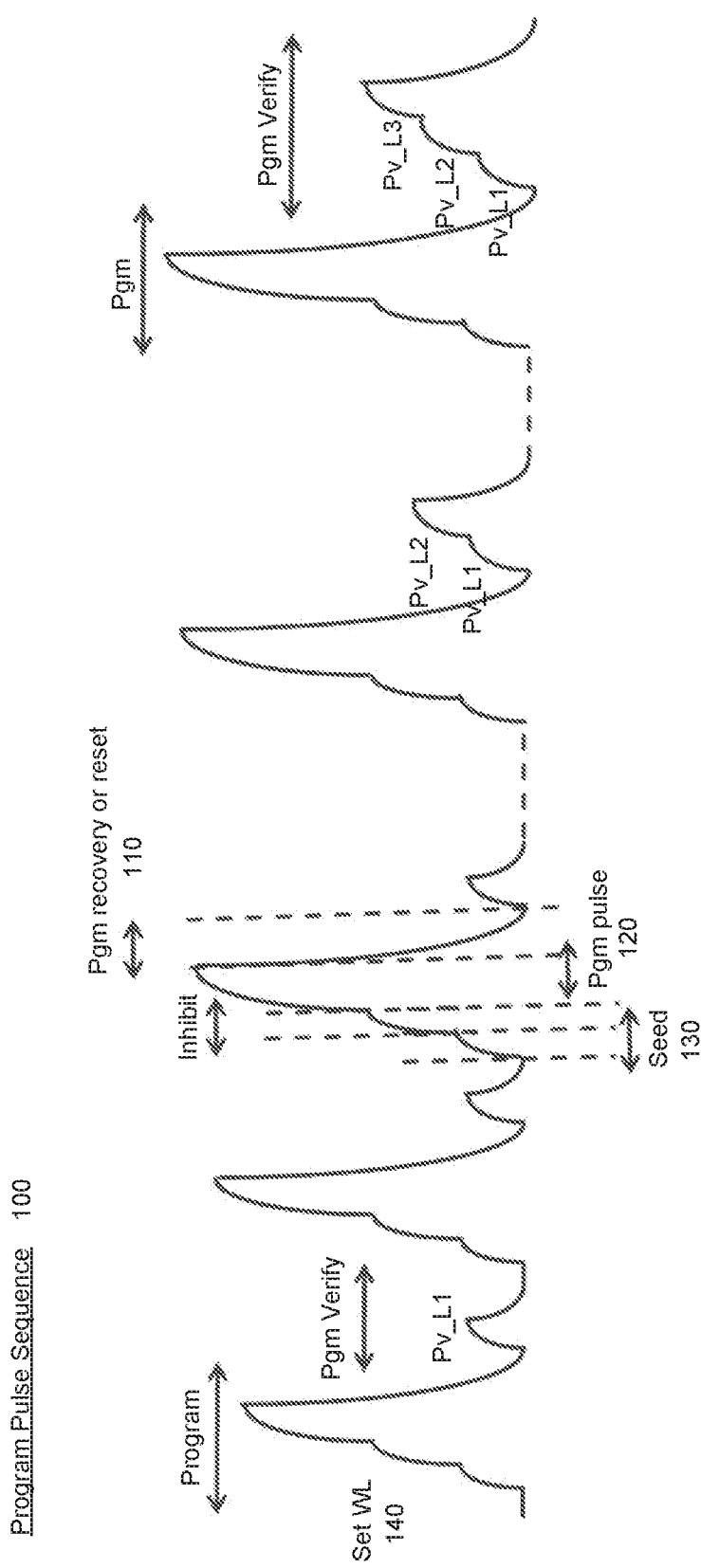
FIG. 1 illustrates a program pulse sequence for writing data to a non-volatile memory (NVM) in accordance with an example embodiment.

Reference will now be made to the exemplary embodiments illustrated, and specific language will be used herein to describe the same. It will nevertheless be understood that no limitation on invention scope is thereby intended.

DESCRIPTION OF EMBODIMENTS

Before the disclosed invention embodiments are described, it is to be understood that this disclosure is not limited to the particular structures, process steps, or materials disclosed herein, but is extended to equivalents thereof as would be recognized by those ordinarily skilled in the relevant arts. It should also be understood that terminology employed herein is used for the purpose of describing particular examples or embodiments only and is not intended to be limiting. The same reference numerals in different drawings represent the same element. Numbers provided in flow charts and processes are provided for clarity in illustrating steps and operations and do not necessarily indicate a particular order or sequence.

Furthermore, the described features, structures, or characteristics can be combined in any suitable manner in one or more embodiments. In the following description, numerous specific details are provided, such as examples of layouts, distances, network examples, etc., to provide a thorough understanding of various invention embodiments. One skilled in the relevant art will recognize, however, that such detailed embodiments do not limit the overall inventive concepts articulated herein, but are merely representative thereof.

As used in this specification and the appended claims, the singular forms "a," "an" and "the" include plural referents unless the context clearly dictates otherwise. Thus, for example, reference to "a bit line" includes a plurality of such bit lines.

Reference throughout this specification to "an example" means that a particular feature, structure, or characteristic described in connection with the example is included in at least one invention embodiment. Thus, appearances of the phrases "in an example" or the like in various places throughout this specification do not necessarily all refer to the same embodiment.

As used herein, a plurality of items, structural elements, compositional elements, and/or materials can be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various invention embodiments and examples can be referred to herein along with alternatives for the various components thereof. It is understood that such embodiments, examples, and alternatives are not to be construed as defacto equivalents of one another, but are to be considered as separate and autonomous representations under the present disclosure.

Furthermore, the described features, structures, or characteristics can be combined in any suitable manner in one or more embodiments. In the following description, numerous specific details are provided, such as examples of layouts, distances, network examples, etc., to provide a thorough understanding of invention embodiments. One skilled in the relevant art will recognize, however, that the technology can be practiced without one or more of the specific details, or with other methods, components, layouts, etc. In other instances, well-known structures, materials, or operations may not be shown or described in detail to avoid obscuring aspects of the disclosure.

In this disclosure, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the compositions nature or characteristics would be permissible if present under the "consisting essentially of" language, even though not expressly recited in a list of items following such terminology. When using an open ended term in this specification, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that any terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

As used herein, comparative terms such as "increased," "decreased," "better," "worse," "higher," "lower," "enhanced," "improved," and the like refer to a property of a device, component, or activity that is measurably different from other devices, components, or activities in a surrounding or adjacent area, in a single device or in multiple comparable devices, in a group or class, in multiple groups or classes, or as compared to the known state of the art. For example, a process that provides "improved" efficiency is a process that requires less time or energy to perform the process than to perform the same or a similar state of the art process. A number of factors can cause such increased risk, including location, fabrication process, number of program pulses applied to the region, etc.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. However, it is to be understood that even when the term "about" is used in the present specification in connection with a specific numerical value, that support for the exact numerical value recited apart from the "about" terminology is also provided.

Numerical amounts and data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 1.5, 2, 2.3, 3, 3.8, 4, 4.6, 5, and 5.1 individually.

This same principle applies to ranges reciting only one numerical value as a minimum or a maximum. Furthermore, such an interpretation should apply regardless of the breadth of the range or the characteristics being described.

Example Embodiments

An initial overview of technology embodiments is provided below and then specific technology embodiments are described in further detail later. This initial summary is intended to aid readers in understanding the technology more quickly, but is not intended to identify key or essential technological features nor is it intended to limit the scope of the claimed subject matter. Unless defined otherwise, all technical and scientific terms used herein have the same meaning as commonly understood by one of ordinary skill in the art to which this disclosure belongs.

Solid state drives (SSDs) are solid-state storage devices that use integrated circuit assemblies as memory to persistently store data. SSDs do not have moving parts (i.e., no moving mechanical components) and can retain data without power. SSDs utilize non-volatile memory (NVM), such as non-volatile NAND-based flash memory. NAND can be single level cell (SLC) NAND which encodes a single bit of information per cell, or multiple level cell (MLC) NAND which encodes more than one bit of information per cell. For example, in TLC NAND, three bits of information are stored per cell in the NAND.

Other examples of non-volatile memory (NVM) include, but are not limited to, phase change memory (PCM), a three dimensional cross point (3D XPoint) memory, memory devices that use chalcogenide phase change material (e.g., chalcogenide glass), a resistive memory, nanowire memory, ferro-electric transistor random access memory (FeTRAM), flash memory other than NAND, such as NOR, magnetoresistive random access memory (MRAM) memory that incorporates memristor technology, and/or spin transfer torque (STT)-MRAM.

FIG. 1 illustrates an exemplary program pulse sequence 100 for writing data to a non-volatile memory (NVM), such as planar NAND (or one-dimensional NAND). The NVM can be included in a data storage device. In addition, the data storage device can include a memory controller configured to execute the program pulse sequence 100 in order to program or write data to the NVM. In other words, by executing the program pulse sequence 100, the memory controller can program or write data to a plurality of cells in the NVM.

In one example, the NVM can be flash memory and can include a flash-array with a grid of columns and rows of floating-gate metal-oxide-semiconductor field-effect transistor (FGMOS) cells. In NAND memory, the cells can be connected in series and resemble a NAND gate. The connection in series prevents the cells from being programmed individually. Rather, the cells in the NAND memory are read in series. In addition, a horizontal line of cells in the NAND memory are referred to as word lines, and a vertical line of cells in the NAND memory are referred to as bit lines. Control gates of the cells are connected to a particular word line. Drains of the cells are connected to represent a data bus. Source lines of the cells are connected to a common ground. Voltage combinations applied to the word lines and/or the bit lines define read, erase or program operations.

In one example, the program pulse sequence 100 can be associated with a selected word line 140 in the NVM. In addition, the program pulse sequence 100 can include a defined number of program pulse levels. Each program pulse level can correspond to a defined group of memory cells in the NVM in which data is being programmed during the program pulse sequence. In other words, during each program pulse level in the program pulse sequence 100, the group of memory cells corresponding to that particular program pulse level can be programmed. The number of program pulse levels in the program pulse sequence 100 can depend on a number of bits per cell utilized in the NVM. For example, the program pulse sequence 100 can include three program pulse levels when the NVM utilizes two-bit per cell technology, or the program pulse sequence 100 can include seven program pulse levels when the NVM utilizes three-bit per cell technology.

In one example, the program pulse sequence 100 can include a number of verification checks to verify that data is successfully written to the NVM. The verification checks can be referred to as pass/fail checks and can function to determine whether data written to the NVM during the program pulse sequence 100 is successful or unsuccessful, respectively. More specifically, the program pulse sequence 100 can include a distribution program check (DPC), a DPC elaboration check, and a count fail byte (CFBYTE) check to verify that data is successfully written to the NVM during the program pulse sequence 100. The DPC check and the DPC elaboration check can be performed in each program pulse level in the program pulse sequence 100, except a last program pulse level in the program pulse sequence 100. Therefore, the DPC check and the DPC elaboration check are associated with a particular program pulse level. On the other hand, the CFBYTE check can be performed in the last program pulse level in the program pulse sequence 100, such that the CFBYTE check is for all of the program pulse levels in the program pulse sequence 100.

As shown in FIG. 1, the program pulse sequence 100 can include a program recovery or reset sequence 110, a program pulse 120 and a seed operation 130. In one example, the DPC check can be performed during the program recovery or reset sequence 110 in the program pulse sequence. The DPC check can be performed in approximately 3 micro seconds (µs) and can be "hidden" in the program recovery or reset sequence 110. In other words, the DPC check can be performed within the program recovery or reset sequence 110, such that performing the DPC check does not add or contribute additional overhead (e.g., additional programming time or delay) to the program pulse sequence 100. In one example, the DPC elaboration check can be performed in approximately 11 µs during the program pulse 120 in the program pulse sequence 100. In addition, the CFBYTE check can be performed in approximately 3 µs during the seed operation 130 in the program pulse sequence 100. Similar to the DPC check, both the DPC elaboration check and the CFBYTE check can be "hidden" in the program pulse 120 and seed operation 130, respectively, such that neither the DPC elaboration check nor the CFBYTE check add additional overhead (e.g., additional programming time) to the program pulse sequence 100. In other words, the DPC check, DPC elaboration check and CFBYTE check can each be performed within the program recovery or reset sequence 110, program pulse 120 and seed operation 130, respectively, of the program pulse sequence.

Depending on various cell characteristics of the NVM (e.g., NAND), a seed operation may not be used in the program pulse sequence. As a result, the CFBYTE check can no longer be "hidden" in the seed operation, and performing the CFBYTE check can add additional overhead (or additional programming time) to the program pulse sequence. In addition, depending on the cell characteristics, the program pulse in the program pulse sequence can be approximately 4 to 5 µs. As a result, the DPC elaboration check, which can take approximately 11 µs to perform, cannot be "hidden" in the program pulse. Therefore, performing the DPC elaboration check can add additional overhead (or additional programming time) to the program pulse sequence. In addition, when bit lines in the NAND cannot be floated because of impacts to a read window budget (RWB), the DPC elaboration check may be unable to be performed within the time period of the program pulse. In some cases, even when the bit lines in the NAND are floated, the DPC elaboration check cannot be fully contained within, or hidden, in the program pulse of the program pulse sequence, thereby adding additional overhead to the program pulse sequence.

As described in further detail below, during a program verify sequence that follows the program pulse sequence, a memory controller can detect a percentage of passing cells and/or failing cells for each program verify level. The program verify levels in the program verify sequence can correspond to the program pulse levels in the program pulse sequence. Cells can be passing when data has been successfully written to the memory cells, or cells can be failing when data has not been successfully written to the memory cells. When the percentage of passing cells for a particular program verify level is less than a defined threshold, then verification checks can be skipped during a subsequent program pulse sequence with respect to a corresponding program pulse level. In other words, in the subsequent program pulse sequence, the DPC, DPC elaboration and/or CFBYTE checks can be skipped for the corresponding program pulse level when the percentage of passing memory cells is less than the defined threshold. Since performing the verification checks can add additional overhead, skipping the verification checks in the subsequent program pulse sequence can save programming time (or tprog). Alternatively, when the percentage of passing memory cells for a particular program verify level is greater than the defined threshold, then verification checks can be performed during a subsequent program pulse sequence with respect to a corresponding program pulse level.

Figure 2:
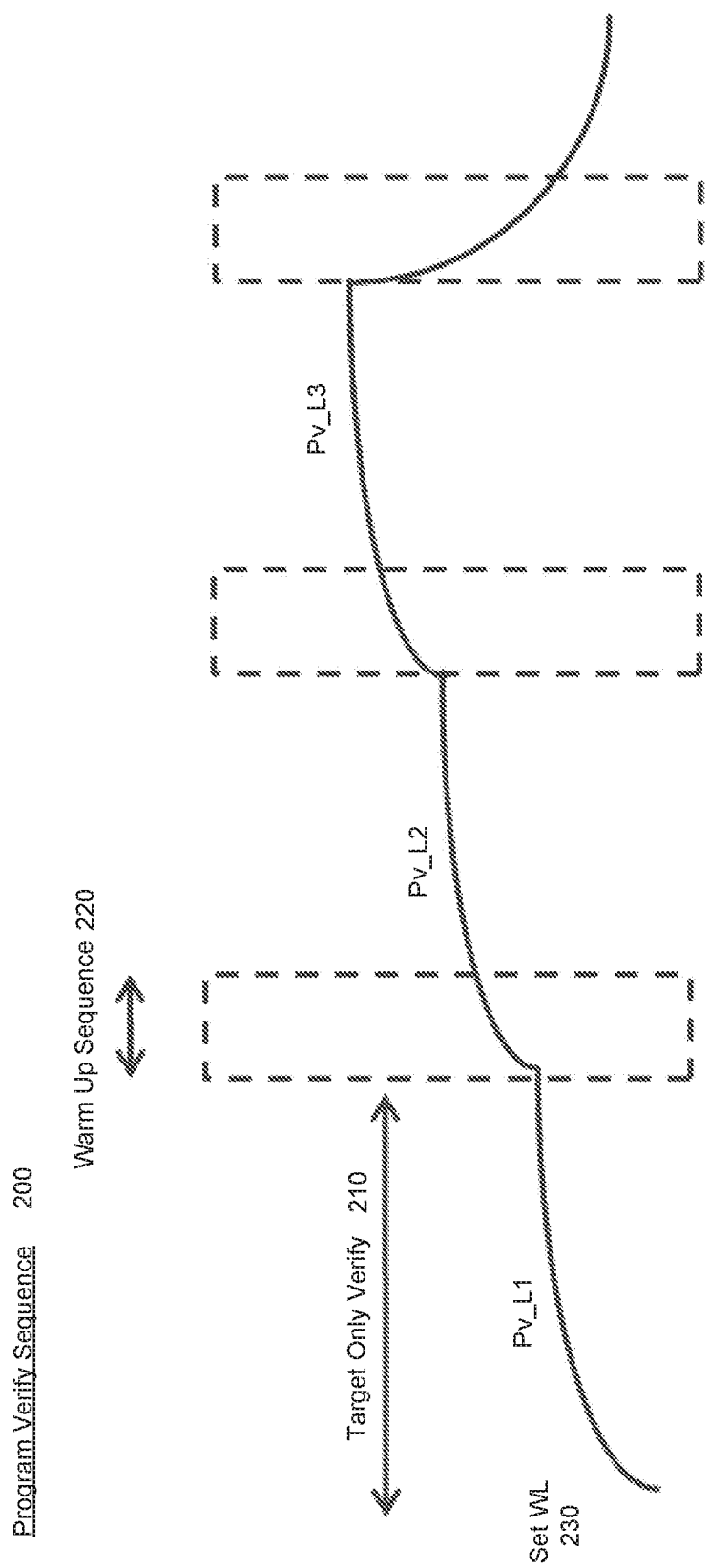
FIG. 2 illustrates a program verify sequence for verifying data written to a non-volatile memory (NVM) in accordance with an example embodiment.

FIG. 2 illustrates an exemplary program verify sequence 200 for verifying data written to a non-volatile memory (NVM), such as NAND. The NVM can be included in a data storage device. In addition, the data storage device can include a memory controller configured to execute the program verify sequence 200 in order to verify the data written to a plurality of cells in the NVM. The memory controller can perform the program verify sequence 200 after a program pulse sequence is performed. The program verify sequence 200 can be associated with a selected word line 230 in the NVM. In some embodiments, the memory controller can be in a separate device from that which includes the NVM.

In one example, the program verify sequence 200 can include a plurality of program verify levels. Each program verify level can be associated with a group of cells for which written data is verified. The program verify levels in the program verify sequence 200 can correspond to program pulse levels in the program pulse sequence. For example, cells corresponding to levels 1, 2 and 3 can be programmed during the program pulse sequence, and data written to the cells corresponding to the levels 1, 2 and 3 can be verified during a subsequent program verify sequence.

Similar to previously described, the number of program verify levels in the program verify sequence 200 can depend on a number of bits per cell utilized in the NVM. For example, the program verify sequence 200 can include three program verify levels when the NVM utilizes two-bit per cell technology, or the program verify sequence 200 can include seven program verify levels when the NVM utilizes three-bit per cell technology. Additionally, nearly any other number of program verify levels can be used in order to achieve a specifically desired result, or accommodate a specific scheme or system, for example, to accommodate a specific memory type, memory configuration, or bit per cell density.

In one example, the program verify sequence 200 can include a target only verify sequence 210 for each program verify level. During the target only verify sequence 210, only cells pertaining to that particular program verify level can be verified. As an example, during the program verify sequence 200, cells corresponding to a first program verify level can be verified during a first target only verify sequence, and then cells corresponding to a second program verify level can be verified during a second target only verify sequence, and then cells corresponding to a third program verify level can be verified during a third target only verify sequence, and so on. Based on the target only verify sequence for each program verify level, a percentage of cells in which data is successfully written (or not successfully written) can be detected. In other words, for each program verify level, a percentage of passing cells (i.e., data is successfully written) or failing cells (i.e., data is not successfully written) can be detected with respect to that program verify level.

In one example, the program verify sequence 200 can include a warm up sequence 220 between each target only verify sequence. During the warm up sequence 220, the selected word line 230 can be prepared for a next target only verify sequence. For a last target only verify sequence in the program verify sequence 200, a warm up sequence preceding the last target only verify sequence can involve discharging the selected word line 230, which can function to prepare for an upcoming program pulse sequence.

In one configuration, after the percentage of passing cells for each program verify level is detected, the percentages can be compared to a defined threshold. With respect to a particular program verify level, if the percentage of passing cells is less than the defined threshold, then verification checks can be skipped in a corresponding program pulse level in a subsequent program pulse sequence. In other words, the DPC check, DPC elaboration check, and/or CFBYTE check can be skipped for the corresponding program pulse level in the subsequent program pulse sequence when the percentage of passing cells is less than the defined threshold. Since performing the verification checks can add additional overhead, skipping the verification checks in the subsequent program pulse sequence can save programming time (tprog).

On the other hand, with respect to a particular program verify level, if the percentage of passing cells is greater than the defined threshold, then verification checks are not skipped in a corresponding program pulse level in a subsequent program pulse sequence. In other words, the DPC check, DPC elaboration check, and/or CFBYTE check may not be skipped for the corresponding program pulse level in the subsequent program pulse sequence when the percentage of passing cells is greater than the defined threshold. Even though performing the verification checks can add additional overhead, the percentage of passing cells being lower than the defined threshold can compel the verification checks to be performed. In other words, in this scenario, the benefits gained by performing the verification checks can outweigh the additional overhead caused by the verification checks.

As shown in the example in FIG. 2, the program verify sequence can include program verify levels of Pv_L1, Pv_L2, and Pv_L3 with respect to the selected word line 230. During a target only verify sequence 210 for Pv_L1, only cells pertaining to Pv_L1 are verified. After the cells for Pv_L1 are verified, the cells for Pv_L2 and Pv_L3 are verified. As a non-limiting example, based on the target only verify sequence for each of Pv_L1, Pv_L2, and Pv_L3, the percentage of passing cells for Pv_L1, Pv_L2, and Pv_L3 can be 20%, 80% and 60%, respectively. The percentages can be compared to a defined threshold, and based on the comparison, the percentage of passing cells for Pv_L1 and Pv_L3 (i.e., 20% and 60%, respectively) can be less than the defined threshold and the percentage of passing cells for Pv_L2 (i.e., 80%) can be greater than the defined threshold. In this case, in a subsequent program pulse sequence, the DPC check, DPC elaboration check, and/or CFBYTE check can be skipped with respect to PV_L1 and Pv_L3, thereby saving programming time (tprog) during the subsequent program pulse sequence. In addition, the DPC check, DPC elaboration check, and/or CFBYTE check may not be skipped with respect to Pv_L2.

Figure 3:
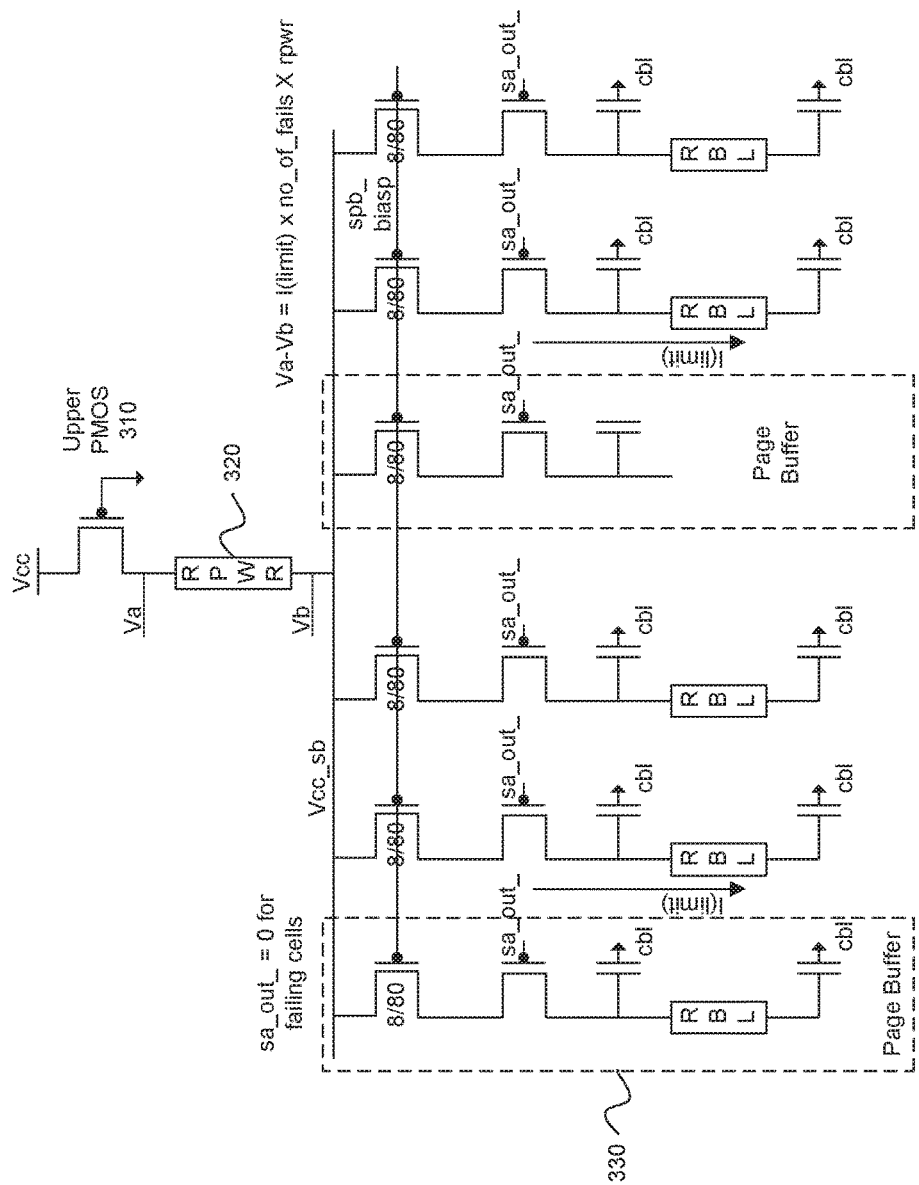
FIG. 3 illustrates a non-volatile memory (NVM) that includes various components for detecting a number of failing cells in which data is not successfully written in accordance with an example embodiment.

FIG. 3 illustrates an exemplary non-volatile memory (NVM) that includes various components for detecting a number of failing cells for which data is not successfully written. After each program verify sequence, the percentage of failing cells (i.e., cells in which data is unsuccessfully written) can be detected with respect to a particular program verify level (e.g., level 1, level 2, level 3, and so on). The percentage of failing cells can be detected using, in part, a memory controller in the NVM. As explained in greater detail below, the percentage of failed cells can be detected through voltage sensing from a pull up path.

In one example, the NVM can include a plurality of page buffers, and each page buffer (e.g., page buffer 330) can include a bit line. The page buffer 330 can include a P-type metal-oxide-semiconductor (PMOS) device. The PMOS device is a current limiting device, and a bias on a gate of the PMOS can be controlled to set a current limit. The page buffer 330 can be associated with a bit line resistance ('rbl') and a bit line capacitance ('cbl').

In addition, the page buffer 330 can include an sa_out_latch for storing pass/fail information for corresponding cells. In other words, after a level-based verify is performed, pass/fail information for the cells for that program verify level can be stored in the sa_out_latches. For example, after a level-based verify for program verify level 1 is performed, the pass/fail information for corresponding cells can be stored in the sa_out_latches. In one example, the value in an sa_out_latch can be set to '0' when a corresponding cell is failing. In other words, the value in the sa_out_latch can be set to '0' when data has not been successfully written to the corresponding cell.

In one example, the plurality of page buffers can be connected to an upper PMOS 310, and a resistance (rpwr) 320 can be placed in between the upper PMOS 310 and the plurality of page buffers. A voltage at one end of the upper PMOS 310 can be defined as Vcc. A first voltage on a first end of the resistance (rpwr) 320 can be represented by Va, and a second voltage on a second end of the resistance (rpwr) 320 can be represented by Vb.

After the level-based verify (e.g., after program verify level 1 is finished), the number of corresponding failing cells can be indicated as "0"s in the sa_out_latches. In addition, a voltage drop across the resistance (rpwr) 320 can be represented by Va–Vb. With respect to a defined program verify level (e.g., level 1), the voltage drop (Va–Vb) can be equal to a current limit ($I_{limit}$) through the upper PMOS 310 and resistance (rpwr) 320 multiplied by a number of cells in the defined program verify level for which data is not successfully written (no_of_fails) multiplied by the resistance (rpwr) 320. The no_of_fails (or number of failing cells) can be based on the number of "0"s in the sa_out_latches. In other words, the number of failing cells (or percentage of failing cells) can be determined based on the voltage drop (Va–Vb) across the resistance (rpwr) 320. As an example, if there are 5 failing cells, then the amount of current flowing through the upper PMOS 310 and the resistance (rpwr) 320 can be equal to 5 multiplied by the current limit ($I_{limit}$), and $(5 \times I_{limit}) \times rpwr$ can be equal to the voltage drop (Va–Vb).

In one configuration, with respect to the defined program verify level, the voltage drop (Va–Vb) across the resistance (rpwr) 320 can be compared to a predefined threshold. In one example, when the voltage drop (Va–Vb) across the resistance (rpwr) 320 is greater than the predefined threshold, one or more verification checks can be skipped in a defined program pulse level of a subsequent program pulse sequence. The program pulse levels can correspond to the program verify levels. The one or more verification checks that are skipped in the defined program pulse level of the subsequent program pulse sequence can include a count fail byte (CFBYTE) check, a distribution program check (DPC) and/or a DPC elaboration check. Alternatively, with respect to the defined program verify level, when the voltage drop (Va–Vb) across the resistance (rpwr) 320 is less than the predefined threshold, one or more verification checks may not be skipped in the defined program pulse level of the subsequent program pulse sequence. In this case, the CFBYTE check, the DPC check and the DPC elaboration check can be performed in the defined program pulse level of the subsequent program pulse when the voltage drop (Va–Vb) across the resistance (rpwr) 320 is less than the predefined threshold.

In one configuration, whether the percentage of cells are passing or failing for a particular program verify level can be determined for each program verify sequence. In other words, a subsequent program pulse sequence may or may not include the verification checks with respect to particular levels. However, in a subsequent program verify following the subsequent program pulse sequence, the percentage of passing/failing cells for each of the program verify levels can be determined again.

As a non-limiting example, based on the voltage drop (Va–Vb) across the resistance (rpwr) in comparison to the defined threshold, verification checks for a first level can be skipped in a subsequent program pulse sequence, and verification checks for a second level and a third level may not be skipped in the subsequent program pulse sequence.

Figure 4:
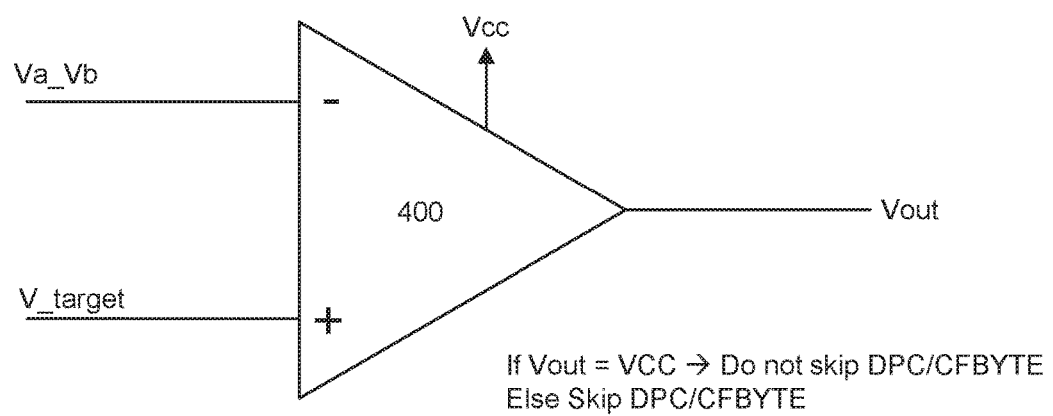
FIG. 4 illustrates a comparison for determining whether to skip verification checks in a subsequent program pulse sequence in accordance with an example embodiment.
Figure 5:
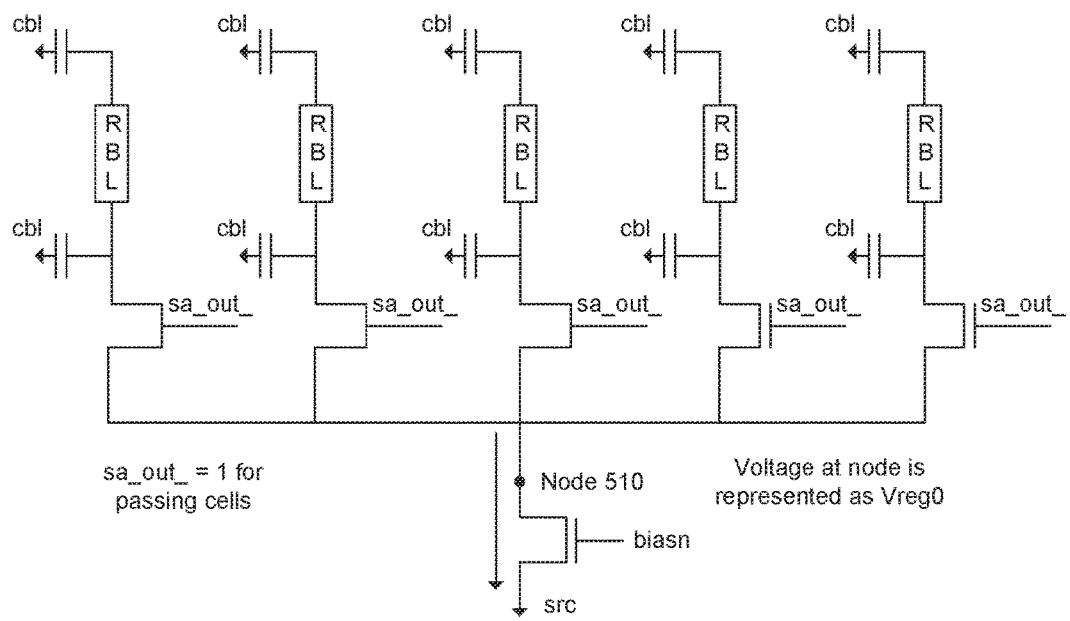
FIG. 5 illustrates a non-volatile memory (NVM) that includes various components for detecting a number of passing cells in which data is successfully written in accordance with an example embodiment.

FIG. 4 illustrates an exemplary comparison for determining whether to skip verification checks in a subsequent program pulse sequence. A comparator 400 can receive a first voltage of Va_Vb and a second voltage of V_target, and produce an output voltage of Vout. In addition, the comparator 400 can be connected to a voltage of Vcc. In one example, if Vout is substantially equal to Vcc, then the verification checks may not be skipped in the subsequent program pulse sequence (i.e., the verification checks can be performed in the subsequent program pulse sequence). Alternatively, if Vout is not equal to Vcc, then the verification checks can be skipped in the subsequent program pulse sequence. In other words, Va_Vb being greater than V_target implies that a number of passing cells is less than a defined target, so the verification checks are skipped in the subsequent program pulse sequence, FIG. 5 illustrates an exemplary non-volatile memory (NVM) that includes various components for detecting a percentage of passing cells in which data is successfully written. In one example, the NVM can include a plurality of bit lines, which can include a bit line resistance ('rbl') and a bit line capacitance ('cbl'). The percentage of passing cells can be detected using, in part, a memory controller in the NVM. In addition, the NVM can include a shielded bit line architecture, in which only even bit lines or odd bit lines are sensed at a given time. As explained in greater detail below, the percentage of passing cells can be detected through capacitive load sensing through a current limited pull down path.

In one example, each bit line can be coupled to an sa_out_latch for storing pass/fail information for corresponding cells. In other words, after a particular level (e.g., a program verify level) is verified, pass/fail information for the cells corresponding to that level can be stored in the sa_out_latches. For example, after a level-based verify for program verify level 1 is performed, the pass/fail information for corresponding cells can be stored in the sa_out_latches. In one example, the value in the sa_out_latch can be set to '1' when a corresponding cell is passing. In other words, the value in the sa_out_latch can be set to '1' when data has been successfully written to the cell.

In one example, the plurality of bit lines can be connected through a pull down NMOS transistor, wherein a gate of the NMOS transistor is connected to a node 510. The node 510 can be associated with a voltage of Vreg0. The node 510 can be connected to another transistor, which is referred to as biasn.

After the level-based verify (e.g., after program verify level 1 is finished), the number of corresponding passing cells can be indicated as "1"s in the sa_out_latches. Since the bit lines are connected to the node 510, a rate of discharge of Vreg0 can be determined. The number of passing cells (or percentage of passing cells) can be determined based on the rate of discharge of Vreg0. In one example, the rate of discharge at Vreg0 can be a function of a current limit ($I_{limit}$) through the NMOS transistor and the number of passing cells. As the number of passing cells increase, the rate of discharge will become slower. In other words, as an increased number of sa_out_latches store a "1", the rate of discharge will become slower.

In one configuration, with respect to the defined program verify level, the rate of discharge of Vreg0 can be compared to a predefined threshold. In one example, when the rate of discharge of Vreg0 is greater (or faster) than the predefined threshold, one or more verification checks can be skipped in a defined program pulse level of a subsequent program pulse sequence. The program pulse levels can correspond to the program verify levels. The one or more verification checks that are skipped in the defined program pulse level of the subsequent program pulse sequence can include a count fail byte (CFBYTE) check, a distribution program check (DPC) and/or a DPC elaboration check. Alternatively, with respect to the defined program verify level, when the rate of discharge at Vreg0 is less (or slower) than the predefined threshold, one or more verification checks may not be skipped in the defined program pulse level of the subsequent program pulse sequence. In this case, the CFBYTE check, the DPC check and the DPC elaboration check can be performed in the defined program pulse level of the subsequent program pulse when the rate of discharge at Vreg0 is less (or slower) than the predefined threshold.

As a non-limiting example, based on the rate of discharge of Vreg0 in comparison to the defined threshold, verification checks for a third level can be skipped in a subsequent program pulse sequence, and verification checks for a first level and a second level may not be skipped in the subsequent program pulse sequence.

Figure 6:
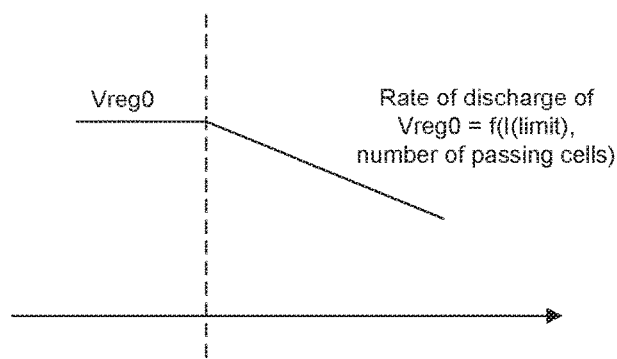
FIG. 6 illustrates a rate of discharge as a function of a number of passing cells in a non-volatile memory (NVM) in accordance with an example embodiment.

FIG. 6 illustrates an exemplary rate of discharge as a function of a number of passing cells in a non-volatile memory (NVM). The rate of discharge can be represented by Vreg0, wherein Vreg0 is associated with a node that is connected to a plurality of bit lines. In one example, the rate of discharge of Vreg0 can be a function of a current limit ($I_{limit}$) and the number of passing cells. As the number of passing cells increase, the rate of discharge will become slower. In other words, as an increased number of sa_out_latches store a "1", the rate of discharge will become slower.

Figure 7:
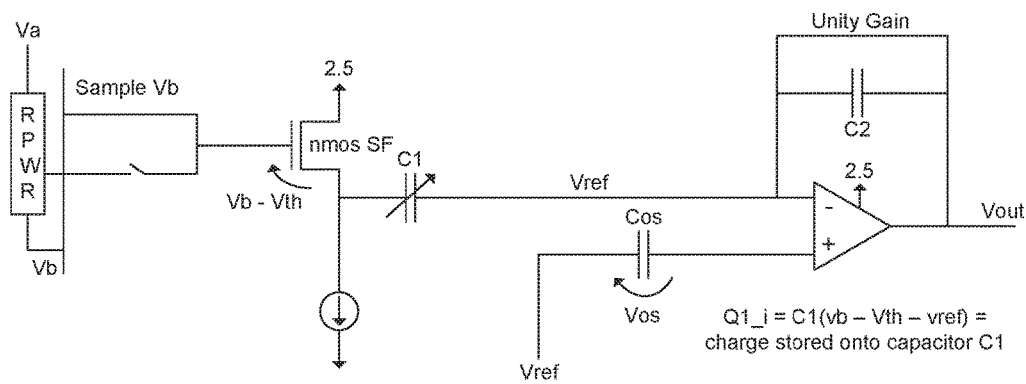
FIG. 7 illustrates circuitry for detecting a voltage drop across a resistor in accordance with an example embodiment.
Figure 8:
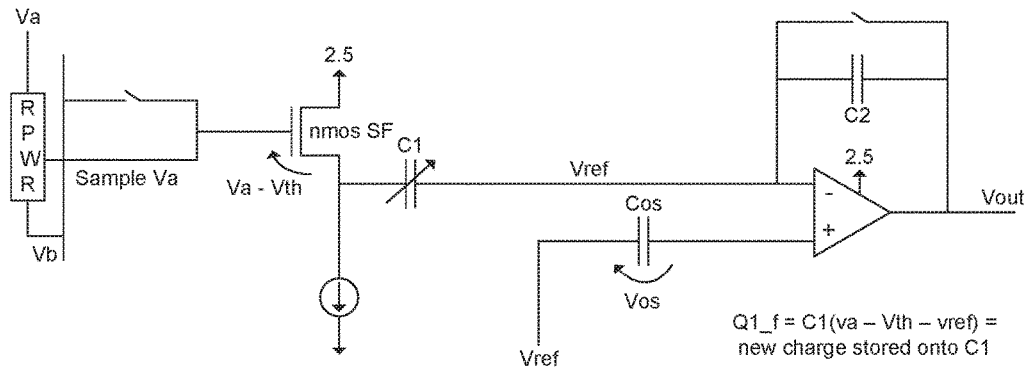
FIG. 8 illustrates circuitry for detecting a voltage drop across a resistor in accordance with an example embodiment.

FIGS. 7 and 8 illustrate exemplary circuitry for detecting a voltage drop (Va−Vb) across a resistor (rpwr). As shown in FIG. 7, a voltage Vb can be sampled. A voltage across an NMOS source follower (SF) can be represented by (Vb−Vth). An initial charge stored on a capacitor (C1) can be represented by C1_i, wherein C1_i=C1(Vb−Vth−Vref). As shown in FIG. 8, a voltage Va can be sampled. A voltage across the NMOS SF can be represented by Va−Vth. A new charge stored on the capacitor (C1) can be represented by C1_f, wherein C1_f=C1(Va−Vth−Vref). As shown in FIGS. 7 and 8, the exemplary circuitry for detecting the voltage drop can be associated with an active phase. In addition, prior to the active phase, the circuitry can be associated with an auto zero phase. After completion of the auto zero phase, voltages Vb and Va can be sampled (in the active phase) and the voltage drop (Va−Vb) across the resistor (rpwr) can be determined.

Moreover, C1_i=C1(Vb−Vth−Vboost_ref) and C1_f=C1(Va−Vth−Vboost_ref). A change in Q (ΔQ)=C1_i−C1_f=C1(Va−Vb). Vth is a common mode and can be removed. Threshold mismatches on an SF stage can be ignored and no compensation is needed. The change in Q (ΔQ)=Q2=C2(Vout−Vref). Since the node common to C1 and C2 is an isolated node, any charge moving away from C1 is stored onto C2. Next, C1(Va−Vb)=C2(Vout−Vref), and Vout=(C1/C2)×(Va−Vb)+Vref. Based on the foregoing, Va−Vb can be solved. As previously discussed, (Va−Vb) can be compared to a predefined threshold, and based on (Va−Vb) in relation to the predefined threshold, verification checks may or may not be skipped in a subsequent program pulse sequence.

Figure 9:
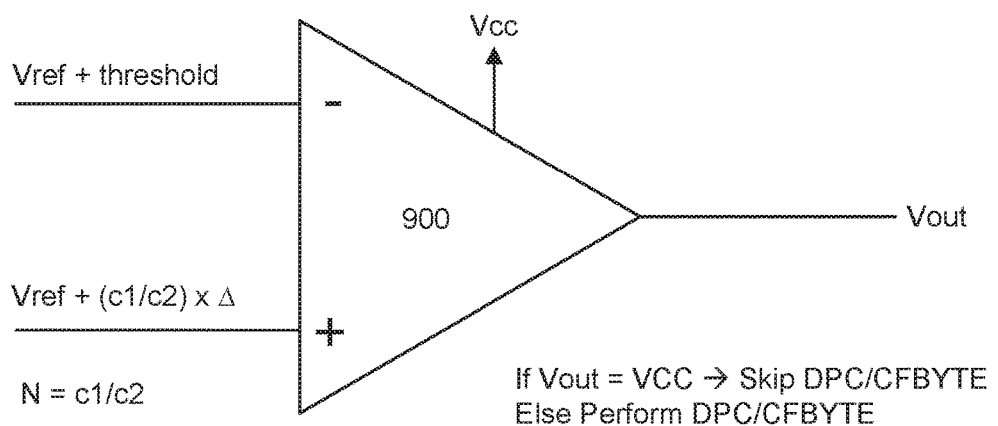
FIG. 9 illustrates a comparison for determining whether to skip verification checks in a subsequent program pulse sequence in accordance with an example embodiment.

FIG. 9 illustrates an exemplary comparison for determining whether to skip verification checks in a subsequent program pulse sequence. A comparator 900 can receive a first voltage of Vref+threshold and a second voltage of V_ref+(c1/c2)×Δ, wherein Δ=Va−Vb, and produce an output voltage of Vout. In addition, the comparator 900 can be connected to a voltage of Vcc. In one example, if Vout is substantially equal to Vcc, then the verification checks can be skipped in the subsequent program pulse sequence. Alternatively, if Vout is not equal to Vcc, then the verification checks may not be skipped in the subsequent program pulse sequence (i.e., the verification checks can be performed in the subsequent program pulse sequence).

Figure 10:
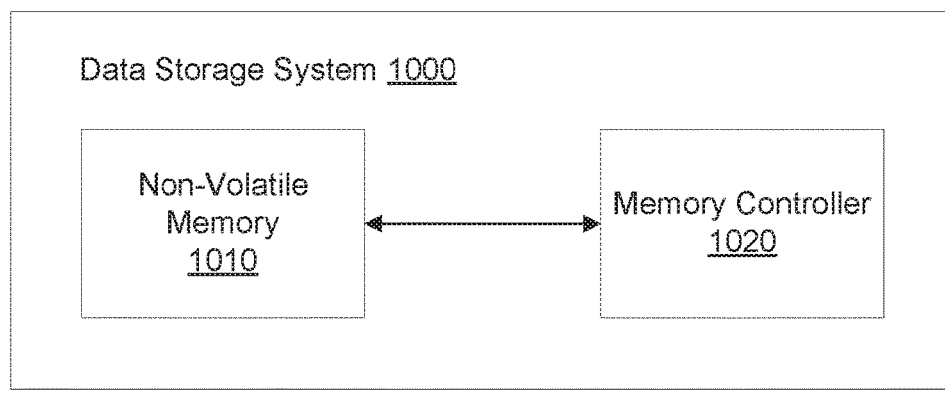
FIG. 10 illustrates a data storage device comprising a non-volatile memory (NVM) and a memory controller configured to reduce programming time when writing data to the NVM in accordance with an example embodiment.

FIG. 10 illustrates an exemplary data storage device 1000 configured to reduce programming time when writing data to a non-volatile memory (NVM) 1010. The data storage device 1000 can comprise the NVM 1010 and a memory controller 1020. The memory controller 1020 can initiate a program pulse to write data to the NVM 1010. The memory controller 1020 can initiate a program verify sequence to verify the data written to the NVM 1010, wherein the program verify sequence includes one or more program verify levels that each correspond to memory cells in the NVM 1010 for which written data is being verified. The memory controller 1020 can detect an approximate percentage of memory cells for each program verify level in the program verify sequence for which data is successfully written. The memory controller 1020 can determine to skip one or more verification checks in one or more program verify levels of a subsequent program pulse when the approximate percentage of memory cells in which data is successfully written for one or more program verify levels in the program verify sequence is less than a defined threshold, wherein skipping the one or more verification checks in the subsequent program pulse reduces programming time when writing data to the NVM 1010.

Figure 11:
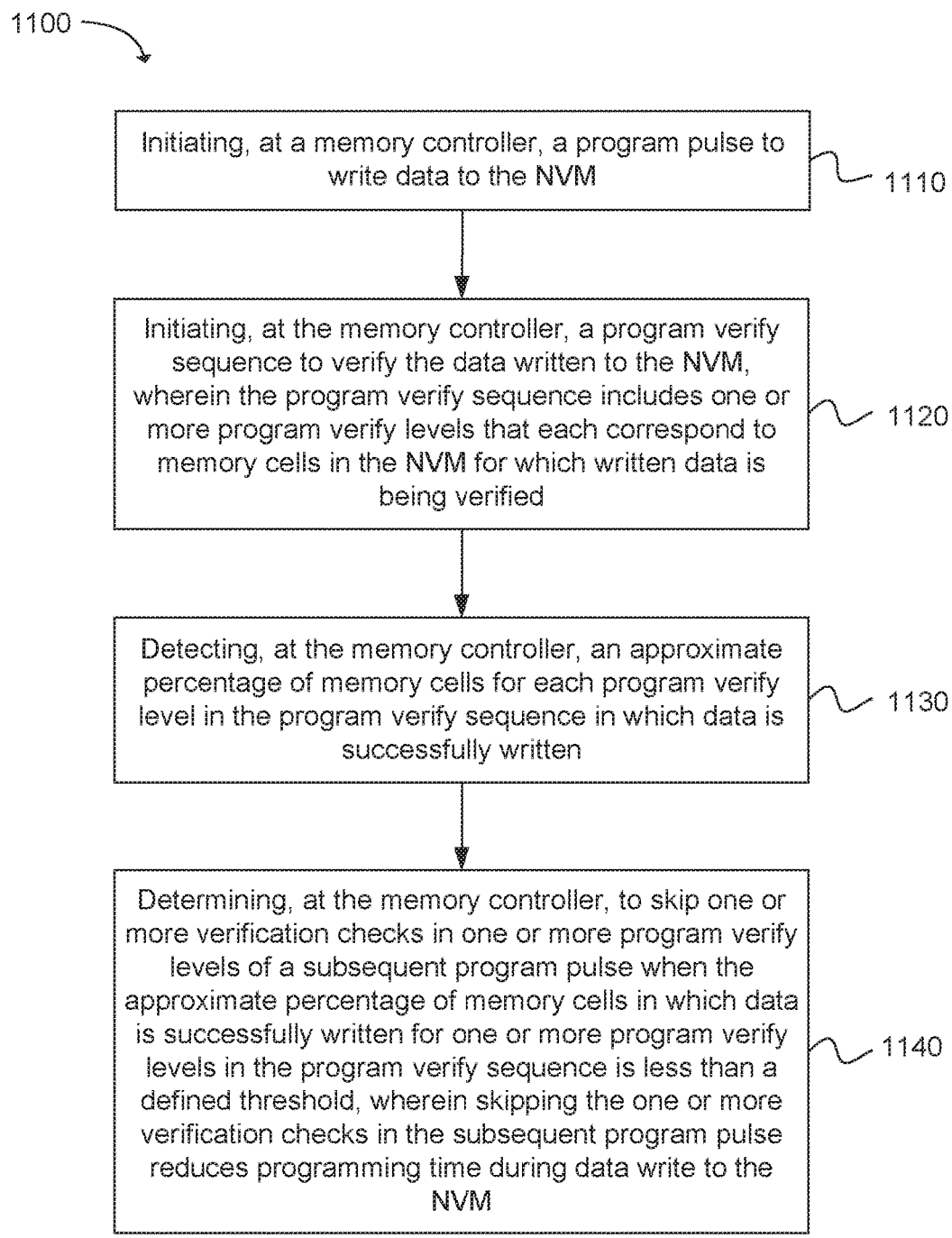
FIG. 11 depicts a flowchart of a method for reducing programming time in a non-volatile memory (NVM) in accordance with an example embodiment.

Another example provides a method 1100 for reducing programming time in a non-volatile memory (NVM), as shown in the flow chart in FIG. 11. The method can be executed as instructions on a machine, where the instructions are included on at least one computer readable medium or one non-transitory machine readable storage medium. The method can include the operation of: initiating, at a memory controller, a program pulse to write data to the NVM, as in block 1110. The method can include the operation of: initiating, at the memory controller, a program verify sequence to verify the data written to the NVM, wherein the program verify sequence includes one or more program verify levels that each correspond to memory cells in the NVM for which written data is being verified, as in block 1120. The method can include the operation of: detecting, at the memory controller, a percentage of memory cells for each program verify level in the program verify sequence in which data is successfully written, as in block 1130. The method can include the operation of: determining, at the memory controller, to skip one or more verification checks in one or more program verify levels of a subsequent program pulse when the percentage of memory cells in which data is successfully written for one or more program verify levels in the program verify sequence is less than a defined threshold, wherein skipping the one or more verification checks in the subsequent program pulse reduces programming time when writing data to the NVM, as in block 1140.

Figure 12:
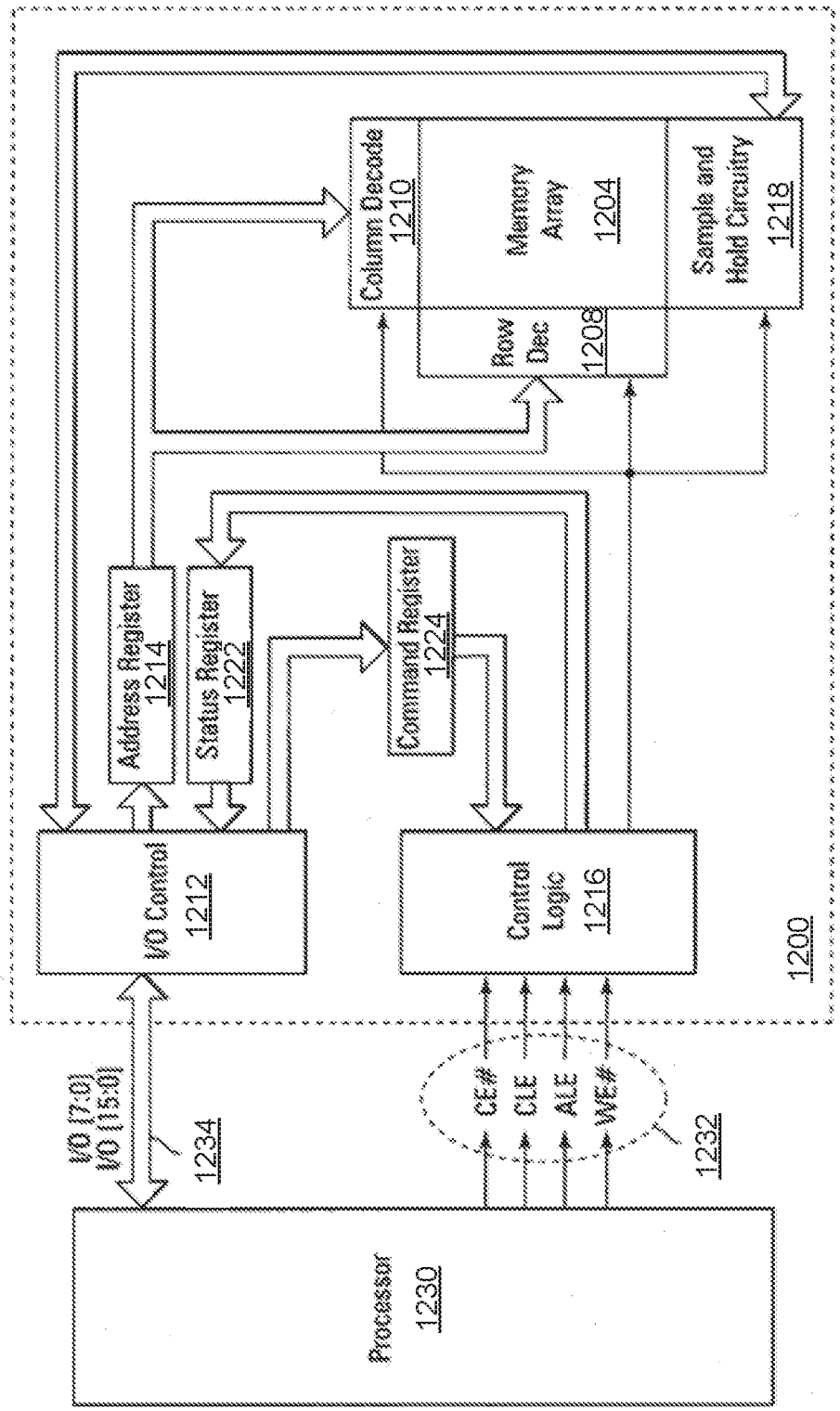
FIG. 12 illustrates a memory system diagram in accordance with an example embodiment.

FIG. 12 is a simplified block diagram of a memory device 1200 according to an invention embodiment, and on which various methods can be practiced. Memory device 1200 includes an array of memory cells 1204 arranged in rows and columns. Although the various embodiments will be described primarily with reference to NAND memory arrays, the various embodiments are not limited to a specific architecture of the memory array 1204. Some examples of specific array architectures include NOR arrays, AND arrays, PCM arrays, and virtual ground arrays. In general, however, the embodiments described herein are adaptable to any array architecture permitting generation of a data signal indicative of state of a memory cell, such as through a the threshold voltage.

A row decode circuitry 1208 and a column decode circuitry 1210 are provided to decode address signals provided to the memory device 1200. Address signals are received and decoded to access memory array 1204. Memory device 1200 also includes input/output (I/O) control circuitry 1212 to manage input of commands, addresses and data to the memory device 1200 as well as output of data and status information from the memory device 1200. An address register 1214 is coupled between I/O control circuitry 1212 and row decode circuitry 1208 and column decode circuitry 1210 to latch the address signals prior to decoding. A command register 1224 is coupled between I/O control circuitry 1212 and control logic 1216 to latch incoming commands. Control logic 1216 controls access to the memory array 1204 in response to the commands and generates status information for an external processor 1230 (also known as a memory controller as described earlier). The control logic 1216 is coupled to row decode circuitry 1208 and column decode circuitry 1210 to control the row decode circuitry 1208 and column decode circuitry 1210 in response to the addresses.

Control logic 1216 can be coupled to a sample and hold circuitry 1218. The sample and hold circuitry 1218 latches data, either incoming or outgoing, in the form of analog data signals. For example, the sample and hold circuitry could contain capacitors or other analog storage devices for sampling either an incoming data signal representing data to be written to a memory cell or an outgoing data signal indicative of the threshold voltage sensed from a memory cell. The sample and hold circuitry 1218 can further provide for amplification and/or buffering of the sampled signal to provide a stronger data signal to an external device.

The handling of analog data signals can take an approach where charge levels generated are stored on capacitors. A charge can be stored on a capacitor in response to subjecting it to a data signal indicative of an actual or target threshold voltage of a memory cell for reading or programming, respectively, the memory cell. This charge could then be converted to an analog data signal using a differential amplifier having a grounded input or other reference signal as a second input. The output of the differential amplifier could then be passed to the I/O control circuitry 1212 for output from the memory device, in the case of a read operation, or used for comparison during one or more verify operations in programming the memory device. It is noted that the I/O control circuitry 1212 could optionally include analog-to-digital conversion functionality and digital-to-analog conversion (DAC) functionality to convert read data from an analog data signal to a digital bit pattern and to convert write data from a digital bit pattern to an analog signal such that the memory device 1200 could be adapted for communication with either an analog or digital data interface.

During a programming operation, target memory cells of the memory array 1204 are programmed until voltages indicative of their Vt levels match the levels held in the sample and hold circuitry 1218. This can be accomplished, as one example, using differential sensing devices to compare the held voltage level to a threshold voltage of the target memory cell. Much like traditional memory programming, programming pulses could be applied to a target memory cell to increase its threshold voltage until reaching or exceeding the desired value. In a read operation, the Vt levels of the target memory cells are passed to the sample and hold circuitry 1218 for transfer to an external processor (not shown in FIG. 12) either directly as analog signals or as digitized representations of the analog signals depending upon whether ADC/DAC functionality is provided external to, or within, the memory device.

Threshold voltages of cells can be determined in a variety of manners. For example, an access line, such as those typically referred to as word lines, voltage could be sampled at the point when the target memory cell becomes activated. Alternatively, a boosted voltage could be applied to a first source/drain side of a target memory cell, and the threshold voltage could be taken as a difference between its control gate voltage and the voltage at its other source/drain side. By coupling the voltage to a capacitor, charge would be shared with the capacitor to store the sampled voltage. Note that the sampled voltage need not be equal to the threshold voltage, but merely indicative of that voltage. For example, in the case of applying a boosted voltage to a first source/drain side of the memory cell and a known voltage to its control gate, the voltage developed at the second source/drain side of the memory cell could be taken as the data signal as the developed voltage is indicative of the threshold voltage of the memory cell.

Sample and hold circuitry 1218 can include caching, i.e., multiple storage locations for each data value, such that the memory device 1200 can be reading a next data value while passing a first data value to the external processor, or receiving a next data value while writing a first data value to the memory array 1204. A status register 1222 is coupled between I/O control circuitry 1212 and control logic 1216 to latch the status information for output to the external processor.

Memory device 1200 receives control signals at control logic 1216 over a control link 1232. The control signals can include a chip enable CE#, a command latch enable CLE, an address latch enable ALE, and a write enable WE#. Memory device 1200 can receive commands (in the form of command signals), addresses (in the form of address signals), and data (in the form of data signals) from an external processor over a multiplexed input/output (I/O) bus 1234 and output data to the external processor over I/O bus 1234.

In a specific example, commands are received over input/output (I/O) pins [7:0] of I/O bus 1234 at I/O control circuitry 1212 and are written into command register 1224. The addresses are received over input/output (I/O) pins [7:0] of bus 1234 at I/O control circuitry 1212 and are written into address register 1214. The data can be received over input/output (I/O) pins [7:0] for a device capable of receiving eight parallel signals, or input/output (I/O) pins [15:0] for a device capable of receiving sixteen parallel signals, at I/O control circuitry 1212 and are transferred to sample and hold circuitry 1218. Data also can be output over input/output (I/O) pins [7:0] for a device capable of transmitting eight parallel signals or input/output (I/O) pins [15:0] for a device capable of transmitting sixteen parallel signals. It will be appreciated by those skilled in the art that additional circuitry and signals can be provided, and that the memory device of FIG. 12 has been simplified to help focus on the embodiments of the disclosure.

While FIG. 12 has been described with respect to sample and hold circuitry 1218, it should be understood that the control logic 1216 could be coupled to data latches instead of sample and hold circuitry 1218 without departing from the scope of the disclosure. During a write operation, target memory cells of the memory array 1204 are programmed, for example using two sets of programming pulses as described above, until voltages indicative of their Vt levels match the data held in the data latches. This can be accomplished, as one example, using differential sensing devices to compare the held data to a threshold voltage of the target memory cell.

Additionally, while the memory device of FIG. 12 has been described in accordance with popular conventions for receipt and output of the various signals, it is noted that the various embodiments are not limited by the specific signals and I/O configurations described. For example, command and address signals could be received at inputs separate from those receiving the data signals, or data signals could be transmitted serially over a single I/O line of I/O bus 1234. Because the data signals represent bit patterns instead of individual bits, serial communication of an 8-bit data signal could be as efficient as parallel communication of eight signals representing individual bits.

Figure 13:
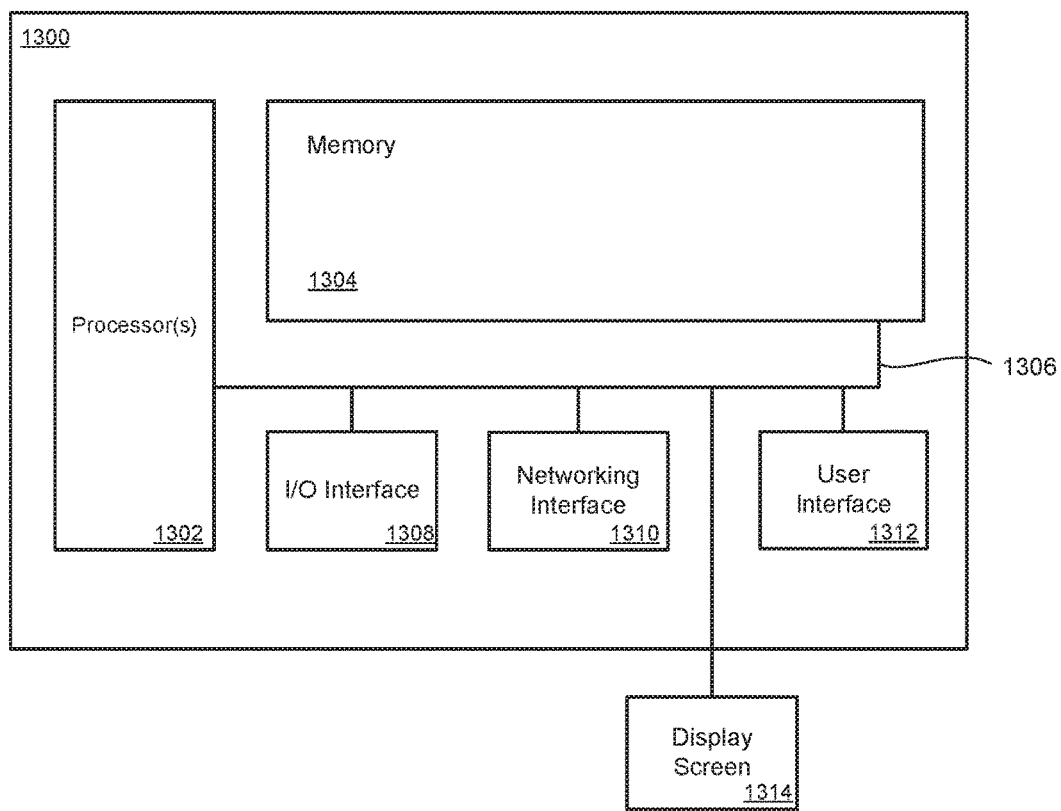
FIG. 13 illustrates a computing system that includes a data storage device in accordance with an example embodiment.

FIG. 13 illustrates a general computing system or device 1300 that can be employed in the present technology. The computing system 1300 can include a processor 1302 in communication with a memory 1304. The memory 1304 can include any device, combination of devices, circuitry, and the like that is capable of storing, accessing, organizing and/or retrieving data. Non-limiting examples include SANs (Storage Area Network), cloud storage networks, volatile or non-volatile RAM, phase change memory, optical media, hard-drive type media, and the like, including combinations thereof.

The computing system or device 1300 additionally includes a local communication interface 1306 for connectivity between the various components of the system. For example, the local communication interface 1306 can be a local data bus and/or any related address or control busses as may be desired.

The computing system or device 1300 can also include an I/O (input/output) interface 1308 for controlling the I/O functions of the system, as well as for I/O connectivity to devices outside of the computing system 1300. A network interface 1310 can also be included for network connectivity. The network interface 1310 can control network communications both within the system and outside of the system. The network interface can include a wired interface, a wireless interface, a Bluetooth interface, optical interface, and the like, including appropriate combinations thereof. Furthermore, the computing system 1300 can additionally include a user interface 1312, a display device 1314, as well as various other components that would be beneficial for such a system.

The processor 1302 can be a single or multiple processors, and the memory 1304 can be a single or multiple memories. The local communication interface 1306 can be used as a pathway to facilitate communication between any of a single processor, multiple processors, a single memory, multiple memories, the various interfaces, and the like, in any useful combination.

The disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device). When a program code is loaded into and executed by a machine, such as a computer, the machine becomes an apparatus for practicing the various techniques.

Circuitry can include hardware, firmware, program code, executable code, computer instructions, and/or software. A non-transitory computer readable storage medium can be a computer readable storage medium that does not include signal. In the case of program code execution on programmable computers, the computing device can include a processor, a storage medium readable by the processor (including volatile and non-volatile memory and/or storage elements), at least one input device, and at least one output device. The volatile and non-volatile memory and/or storage elements can be a RAM, EPROM, flash drive, optical drive, magnetic hard drive, solid state drive, or other medium for storing electronic data. Any node and wireless devices can also include a transceiver module, a counter module, a processing module, and/or a clock module or timer module. One or more programs that can implement or utilize the various techniques described herein can use an application programming interface (API), reusable controls, and the like. Such programs can be implemented in a high level procedural or object oriented programming language to communicate with a computer system. However, the program(s) can be implemented in assembly or machine language, if desired. In any case, the language can be a compiled or interpreted language, and combined with hardware implementations. Exemplary systems or devices can include without limitation, laptop computers, tablet computers, desktop computers, smart phones, computer terminals and servers, storage databases, and other electronics which utilize circuitry and programmable memory, such as household appliances, smart televisions, digital video disc (DVD) players, heating, ventilating, and air conditioning (HVAC) controllers, light switches, and the like.

EXAMPLES

The following examples pertain to specific invention embodiments and point out specific features, elements, or steps that can be used or otherwise combined in achieving such embodiments.

In one example there is provided an apparatus comprising:
a memory controller with circuitry configured to:
initiate a program verify sequence to verify data written to a non-volatile memory (NVM), said program verify sequence having one or more program verify levels that each correspond to memory cells in the NVM for which written data is being verified;
detect an approximate percentage of memory cells for each program verify level in which data is successfully written; and
determine to skip subsequent program pulse verification checks in one or more program verify levels when the approximate percentage of memory cells in which data is successfully written is less than a defined threshold.

In one example of an apparatus, the subsequent program pulse verification checks are skipped in a defined program verify level when the approximate percentage of memory cells in which data is successfully written for that program verify level is less than the defined threshold.

In one example of an apparatus, the memory controller is to skip the verification checks in the subsequent program pulse to reduce programming time during data write to the NVM.

In one example of an apparatus, the verification checks to be skipped in the subsequent program pulse for one or more program verify levels include at least one of: a count fail byte (CFBYTE) check, a distribution program check (DPC) or a DPC elaboration.

In one example of an apparatus, the one or more program verify levels in the program verify sequence are associated with a selected word line in the NVM.

In one example of an apparatus, the memory controller comprises logic further configured to detect the approximate percentage of memory cells for each program verify level in which data is successfully written during a warm up sequence of the program verify sequence.

In one example of an apparatus, the memory controller comprises logic further configured to:
identify a voltage drop (Va−Vb) across a resistance (rpwr) in a NVM storage device, wherein the voltage drop (Va−Vb) is represented by a current limit ($I_{limit}$) multiplied by a number of memory cells in a defined program verify level for which data is not successfully written (no_of_fails) multiplied by the resistance (rpwr);
compare the voltage drop (Va−Vb) across the resistance (rpwr) to a predefined threshold; and either
determine to skip the one or more verification checks in the defined program verify level of the subsequent program pulse when the voltage drop (Va−Vb) across the resistance (rpwr) is greater than the predefined threshold; or
determine to not skip the one or more verification checks in the defined program verify level of the subsequent program pulse when the voltage drop (Va−Vb) across the resistance (rpwr) is less than the predefined threshold.

In one example of an apparatus, the memory controller comprises logic further configured to:
identify a rate of discharge of a voltage ($V_{reg0}$) through a current limited pull down path of a NVM storage device, wherein a shielded bit line architecture is utilized in the NVM storage device; and
detect the approximate percentage of memory cells in a defined program verify level for which data is successfully written based on the rate of discharge of the voltage ($V_{reg0}$) and a current limit ($I_{limit}$).

In one example of an apparatus, the memory controller comprises logic further configured to:
detect, in each program verify sequence, an approximate percentage of memory cells for each program verify level in which data is successfully written; and
determine whether to skip one or more verification checks in a program pulse immediately following each program verify sequence based on the approximate percentage of memory cells in relation to the defined threshold.

In one example of an apparatus, the program verify sequence includes a defined number of program verify levels depending on a defined number of bits per cell utilized in the NVM.

In one example of an apparatus:
the program verify sequence includes three program verify levels when the NVM utilizes two-bit per cell technology; or
the program verify sequence includes seven program verify levels when the NVM utilizes three-bit per cell technology.

In one example of an apparatus, further comprising the NVM, the NVM communicatively coupled to the memory controller, the NVM to include single or multi-dimensional NAND.

In one example of an apparatus, further comprising one or more of:
the NVM, the NVM communicatively coupled to the memory controller;
a processor communicatively coupled to the memory controller;
a network interface communicatively coupled to a processor;
a display communicatively coupled to a processor; or
a battery coupled to a processor.

In one example there is provided, a data storage system operable to reduce programming time during data write to memory, the data storage system comprising:
a memory controller comprising logic to:
initiate a program pulse to write data to a non-volatile memory (NVM);
initiate a program verify sequence to verify the data written to the NVM, wherein the program verify sequence includes one or more program verify levels that each correspond to memory cells in the NVM for which written data is being verified;
detect an approximate percentage of memory cells for each program verify level in the program verify sequence for which data is successfully written; and
determine to skip one or more verification checks in one or more program verify levels of a subsequent program pulse when the approximate percentage of memory cells in which data is successfully written for one or more program verify levels in the program verify sequence is less than a defined threshold, wherein skipping the one or more verification checks in the subsequent program pulse reduces programming time during data write to the NVM.

In one example of a data storage system, the one or more verification checks to be skipped in the subsequent program pulse for one or more verify levels include at least one of: a count fail byte (CFBYTE) check, a distribution program check (DPC) or a DPC elaboration.

In one example of a data storage system, the one or more program verify levels in the program verify sequence are associated with a selected word line in the NVM.

In one example of a data storage system, the memory controller comprises logic configured to detect the approximate percentage of memory cells for each program verify level in which data is successfully written during a warm up sequence of the program verify sequence.

In one example of a data storage system, the memory controller comprises logic further configured to:
identify a voltage drop (Va–Vb) across a resistance (rpwr) in a NVM storage device, wherein the voltage drop (Va–Vb) is represented by a current limit ($I_{limit}$) multiplied by a number of memory cells in a defined program verify level for which data is not successfully written (no_of_fails) multiplied by the resistance (rpwr);
compare the voltage drop (Va–Vb) across the resistance (rpwr) to a predefined threshold; and either
determine to skip the one or more verification checks in the defined program verify level of the subsequent program pulse when the voltage drop (Va–Vb) across the resistance (rpwr) is greater than the predefined threshold; or
determine to not skip the one or more verification checks in the defined program verify level of the subsequent program pulse when the voltage drop (Va–Vb) across the resistance (rpwr) is less than the predefined threshold.

In one example of a data storage system, the memory controller comprises logic further configured to:
identify a rate of discharge of a voltage ($V_{reg0}$) through a current limited pull down path of NVM storage device, wherein a shielded bit line architecture is utilized in the NVM storage device; and
detect the approximate percentage of memory cells in a defined program verify level for which data is successfully written based on the rate of discharge of the voltage ($V_{reg0}$) and a current limit ($I_{limit}$).

In one example of a data storage system, the memory controller comprises logic further configured to:
detect, in each program verify sequence, an approximate percentage of memory cells for each program verify level in which data is successfully written; and
determine whether to skip one or more verification checks in a program pulse immediately following each program verify sequence based on the approximate percentage of memory cells in relation to the defined threshold.

In one example of a data storage system, the program verify sequence includes a defined number of program verify levels depending on a defined number of bits per cell utilized in the NVM.

In one example of a data storage system, the NVM is communicatively coupled to the memory controller, the NVM to include single or multi-dimensional NAND.

In one example of a data storage system, further comprising one or more of:
the NVM, the NVM communicatively coupled to the memory controller;
a processor communicatively coupled to the memory controller;
a network interface communicatively coupled to a processor;
a display communicatively coupled to a processor; or
a battery coupled to a processor.

In one example there is provided, a method for reducing programming time in a non-volatile memory (NVM), the method comprising:
initiating, at a memory controller, a program pulse to write data to the NVM;
initiating, at the memory controller, a program verify sequence to verify the data written to the NVM, wherein the program verify sequence includes one or more program verify levels that each correspond to memory cells in the NVM for which written data is being verified;
detecting, at the memory controller, an approximate percentage of memory cells for each program verify level in the program verify sequence in which data is successfully written; and
determining, at the memory controller, to skip one or more verification checks in one or more program verify levels of a subsequent program pulse when the approximate percentage of memory cells in which data is successfully written for one or more program verify levels in the program verify sequence is less than a defined threshold, wherein skipping the one or more verification checks in the subsequent program pulse reduces programming time during data write to the NVM.

In one example of a method for reducing programming time, the one or more verification checks to be skipped in the subsequent program pulse for one or more verify levels include at least one of: a count fail byte (CFBYTE) check, a distribution program check (DPC) or a DPC elaboration.

In one example of a method for reducing programming time, the one or more program verify levels in the program verify sequence are associated with a selected word line in the NVM.

In one example of a method for reducing programming time, the method further comprises:
identifying a voltage drop (Va–Vb) across a resistance (rpwr) in a NVM storage device, wherein the voltage drop (Va–Vb) is represented by a current limit ($I_{limit}$) multiplied by a number of memory cells in a defined program verify level for which data is not successfully written (no_of_fails) multiplied by the resistance (rpwr);
comparing the voltage drop (Va–Vb) across the resistance (rpwr) to a predefined threshold; and either
determining to skip the one or more verification checks in the defined program verify level of the subsequent program pulse when the voltage drop (Va–Vb) across the resistance (rpwr) is greater than the predefined threshold; or
determining to not skip the one or more verification checks in the defined program verify level of the subsequent program pulse when the voltage drop (Va–Vb) across the resistance (rpwr) is less than the predefined threshold.

In one example of a method for reducing programming time, the method further comprises:
identifying a rate of discharge of a voltage ($V_{reg0}$) through a current limited pull down path of a NVM storage device, wherein a shielded bit line architecture is utilized in the NVM storage device; and
detecting the approximate percentage of memory cells in a defined program verify level for which data is successfully written based on the rate of discharge of the voltage ($V_{reg0}$) and a current limit ($I_{limit}$).

In one example of a method for reducing programming time:
  the program verify sequence includes three program verify levels when the NVM utilizes two-bit per cell technology; or
  the program verify sequence includes seven program verify levels when the NVM utilizes three-bit per cell technology.

In one example of a method for reducing programming time, the NVM and the memory controller are included in a NVM storage device.

In one example of a method for reducing programming time, the NVM is communicatively coupled to the memory controller, the NVM to include single or multi-dimensional NAND.

While the forgoing examples are illustrative of the principles of invention embodiments in one or more particular applications, it will be apparent to those of ordinary skill in the art that numerous modifications in form, usage and details of implementation can be made without the exercise of inventive faculty, and without departing from the principles and concepts of the disclosure.

What is claimed is:

1. An apparatus, comprising:
  a memory controller with circuitry configured to:
    initiate a program verify sequence to verify data written to a non-volatile memory (NVM), said program verify sequence having one or more program verify levels that each correspond to memory cells in the NVM for which written data is being verified;
    detect an approximate percentage of memory cells for each program verify level in which data is successfully written; and
    determine to skip subsequent program pulse verification checks in one or more program verify levels when the approximate percentage of memory cells in which data is successfully written is less than a defined threshold;
  wherein the memory controller further comprises logic configured to either:
    identify a voltage drop (Va-Vb) across a resistance (rpwr) in a NVM storage device, wherein the voltage drop (Va-Vb) is represented by a current limit (Ilimit) multiplied by a number of memory cells in a defined program verify level for which data is not successfully written (no_of_fails) multiplied by the resistance (rpwr);
    compare the voltage drop (Va-Vb) across the resistance (rpwr) to a predefined threshold; and either
    determine to skip the one or more verification checks in the defined program verify level of the subsequent program pulse when the voltage drop (Va-Vb) across the resistance (rpwr) is greater than the predefined threshold; or
    determine to not skip the one or more verification checks in the defined program verify level of the subsequent program pulse when the voltage drop (Va-Vb) across the resistance (rpwr) is less than the predefined threshold;
  or
    identify a rate of discharge of a voltage (Vreg0) through a current limited pull down path of a NVM storage device, wherein a shielded bit line architecture is utilized in the NVM storage device; and
    detect the approximate percentage of memory cells in a defined program verify level for which data is successfully written based on the rate of discharge of the voltage (Vreg0) and a current limit (Ilimit); and
  one or more of:
    the NVM, the NVM being communicatively coupled to the memory controller;
    a processor communicatively coupled to the memory controller;
    a network interface communicatively coupled to a processor;
    a display communicatively coupled to a processor; or
    a battery coupled to a processor.

2. The apparatus of claim 1, wherein the subsequent program pulse verification checks are skipped in a defined program verify level when the approximate percentage of memory cells in which data is successfully written for that program verify level is less than the defined threshold.

3. The apparatus of claim 1, wherein the memory controller is configured to skip the verification checks in the subsequent program pulse to reduce programming time during data write to the NVM.

4. The apparatus of claim 1, wherein the verification checks to be skipped in the subsequent program pulse for one or more program verify levels include at least one of: a count fail byte (CFBYTE) check, a distribution program check (DPC) or a DPC elaboration.

5. The apparatus of claim 1, wherein the one or more program verify levels in the program verify sequence are associated with a selected word line in the NVM.

6. The apparatus of claim 1, wherein the memory controller comprises logic further configured to detect the approximate percentage of memory cells for each program verify level in which data is successfully written during a warm up sequence of the program verify sequence.

7. The apparatus of claim 1, wherein the memory controller comprises logic further configured to:
  detect, in each program verify sequence, an approximate percentage of memory cells for each program verify level in which data is successfully written; and
  determine whether to skip one or more verification checks in a program pulse immediately following each program verify sequence based on the approximate percentage of memory cells in relation to the defined threshold.

8. The apparatus of claim 1, wherein the program verify sequence includes a defined number of program verify levels depending on a defined number of bits per cell utilized in the NVM.

9. The apparatus of claim 1, wherein:
  the program verify sequence includes three program verify levels when the NVM utilizes two-bit per cell technology; or
  the program verify sequence includes seven program verify levels when the NVM utilizes three-bit per cell technology.

10. The apparatus of claim 1, further comprising the NVM, the NVM communicatively coupled to the memory controller, the NVM to include single or multi-dimensional NAND.

11. A data storage system operable to reduce programming time during data write to memory, the data storage system comprising:
  a memory controller comprising logic to:
    initiate a program pulse to write data to a non-volatile memory (NVM);
    initiate a program verify sequence to verify the data written to the NVM, wherein the program verify sequence includes one or more program verify levels that each correspond to memory cells in the NVM for which written data is being verified;

detect an approximate percentage of memory cells for each program verify level in the program verify sequence for which data is successfully written; and determine to skip one or more verification checks in one or more program verify levels of a subsequent program pulse when the approximate percentage of memory cells in which data is successfully written for one or more program verify levels in the program verify sequence is less than a defined threshold, wherein skipping the one or more verification checks in the subsequent program pulse reduces programming time during data write to the NVM;

wherein the memory controller further comprises logic configured to either:

identify a voltage drop (Va-Vb) across a resistance (rpwr) in a NVM storage device, wherein the voltage drop (Va-Vb) is represented by a current limit (Ilimit) multiplied by a number of memory cells in a defined program verify level for which data is not successfully written (no_of_fails) multiplied by the resistance (rpwr);

compare the voltage drop (Va-Vb) across the resistance (rpwr) to a predefined threshold; and either determine to skip the one or more verification checks in the defined program verify level of the subsequent program pulse when the voltage drop (Va-Vb) across the resistance (rpwr) is greater than the predefined threshold; or determine to not skip the one or more verification checks in the defined program verify level of the subsequent program pulse when the voltage drop (Va-Vb) across the resistance (rpwr) is less than the predefined threshold;

or identify a rate of discharge of a voltage (Vreg0) through a current limited pull down path of a NVM storage device, wherein a shielded bit line architecture is utilized in the NVM storage device; and detect the approximate percentage of memory cells in a defined program verify level for which data is successfully written based on the rate of discharge of the voltage (Vreg0) and a current limit (Ilimit); and one or more of:

the NVM, the NVM being communicatively coupled to the memory controller;

a processor communicatively coupled to the memory controller a network interface communicatively coupled to a processor;

a display communicatively coupled to a processor; or a battery coupled to a processor.

12. The data storage system of claim 11, wherein the one or more verification checks to be skipped in the subsequent program pulse for one or more verify levels include at least one of: a count fail byte (CFBYTE) check, a distribution program check (DPC) or a DPC elaboration.

13. The data storage system of claim 11, wherein the one or more program verify levels in the program verify sequence are associated with a selected word line in the NVM.

14. The data storage system of claim 11, wherein the memory controller comprises logic configured to detect the approximate percentage of memory cells for each program verify level in which data is successfully written during a warm up sequence of the program verify sequence.

15. The data storage system of claim 11, wherein the memory controller comprises logic further configured to:

detect, in each program verify sequence, an approximate percentage of memory cells for each program verify level in which data is successfully written; and determine whether to skip one or more verification checks in a program pulse immediately following each program verify sequence based on the approximate percentage of memory cells in relation to the defined threshold.

16. The data storage system of claim 11, wherein the program verify sequence includes a defined number of program verify levels depending on a defined number of bits per cell utilized in the NVM.

17. The data storage system of claim 11, wherein the NVM is communicatively coupled to the memory controller, the NVM to include single or multi-dimensional NAND.

18. A method for reducing programming time in a non-volatile memory (NVM), the method comprising:

initiating, at a memory controller, a program pulse to write data to the NVM;

initiating, at the memory controller, a program verify sequence to verify the data written to the NVM, wherein the program verify sequence includes one or more program verify levels that each correspond to memory cells in the NVM for which written data is being verified;

detecting, at the memory controller, an approximate percentage of memory cells for each program verify level in the program verify sequence in which data is successfully written; and determining, at the memory controller, to skip one or more verification checks in one or more program verify levels of a subsequent program pulse when the approximate percentage of memory cells in which data is successfully written for one or more program verify levels in the program verify sequence is less than a defined threshold, wherein skipping the one or more verification checks in the subsequent program pulse reduces programming time during data write to the NVM;

wherein the one or more program verify levels in the program verify sequence are associated with a selected word line in the NVM; and further comprising one of:

identifying a voltage drop (Va-Vb) across a resistance (rpwr) in a NVM storage device, wherein the voltage drop (Va-Vb) is represented by a current limit (Ilimit) multiplied by a number of memory cells in a defined program verify level for which data is not successfully written (no_of_fails) multiplied by the resistance (rpwr);

comparing the voltage drop (Va-Vb) across the resistance (rpwr) to a predefined threshold; and either determining to skip the one or more verification checks in the defined program verify level of the subsequent program pulse when the voltage drop (Va-Vb) across the resistance (rpwr) is greater than the predefined threshold; or determining to not skip the one or more verification checks in the defined program verify level of the subsequent program pulse when the voltage drop (Va-Vb) across the resistance (rpwr) is less than the predefined threshold;

or identifying a rate of discharge of a voltage (Vreg0) through a current limited pull down path of a NVM storage device, wherein a shielded bit line architecture is utilized in the NVM storage device; and detecting the approximate percentage of memory cells in a defined program verify level for which data is successfully written based on the rate of discharge of the voltage (Vreg0) and a current limit (Ilimit).

19. The method of claim 18, wherein the one or more verification checks to be skipped in the subsequent program pulse for one or more verify levels include at least one of: a count fail byte (CFBYTE) check, a distribution program check (DPC) or a DPC elaboration.

20. The method of claim 18, wherein the NVM is communicatively coupled to the memory controller, the NVM to include single or multi-dimensional NAND.

* * * * *